(12) United States Patent
Nishiyama et al.

(10) Patent No.: US 9,236,422 B2
(45) Date of Patent: Jan. 12, 2016

(54) DISPLAY PANEL AND PRODUCTION METHOD FOR SAME

(75) Inventors: Seiji Nishiyama, Osaka (JP); Yasushi Naito, Osaka (JP)

(73) Assignee: JOLED INC., Tokyo (JP)

( * ) Notice: Subject to any disclaimer, the term of this patent is extended or adjusted under 35 U.S.C. 154(b) by 223 days.

(21) Appl. No.: 14/236,361

(22) PCT Filed: Aug. 3, 2011

(86) PCT No.: PCT/JP2011/004379
§ 371 (c)(1),
(2), (4) Date: Jan. 31, 2014

(87) PCT Pub. No.: WO2013/018136
PCT Pub. Date: Feb. 7, 2013

(65) Prior Publication Data
US 2014/0151709 A1    Jun. 5, 2014

(51) Int. Cl.
*H01L 27/32* (2006.01)
*G02F 1/13* (2006.01)
*G02B 5/20* (2006.01)
*H01L 51/00* (2006.01)

(52) U.S. Cl.
CPC ............ *H01L 27/3246* (2013.01); *G02B 5/201* (2013.01); *H01L 27/3211* (2013.01); *H01L 27/3218* (2013.01); *H01L 27/3262* (2013.01); *H01L 51/0031* (2013.01)

(58) Field of Classification Search
CPC ............... G02F 1/13454; H01L 29/66757; H01L 29/78621; H01L 27/12; H01L 27/1214
USPC ............................................. 438/16; 257/72
See application file for complete search history.

(56) References Cited

U.S. PATENT DOCUMENTS

| 5,443,922 | A | 8/1995 | Nishizaki et al. |
|---|---|---|---|
| 8,466,468 | B2 | 6/2013 | Kondoh et al. |
| 8,604,492 | B2 | 12/2013 | Matsushima |
| 8,604,493 | B2 | 12/2013 | Matsushima |
| 8,604,494 | B2 | 12/2013 | Matsushima |
| 8,604,495 | B2 | 12/2013 | Matsushima |
| 2007/0001954 | A1 | 1/2007 | Shishido et al. |
| 2007/0075627 | A1 | 4/2007 | Kimura et al. |

(Continued)

FOREIGN PATENT DOCUMENTS

| JP | 02-130524 | 5/1990 |
|---|---|---|
| JP | 05-163488 | 6/1993 |

(Continued)

OTHER PUBLICATIONS

International Search Report (ISR) in International Patent Application No. PCT/JP2011/004379, dated Nov. 1, 2011.

(Continued)

*Primary Examiner* — Monica D Harrison
(74) *Attorney, Agent, or Firm* — Greenblum & Bernstein, P.L.C.

(57) ABSTRACT

Provided is a display panel having a plurality of pixels arranged in a matrix of rows and columns. Each of the pixels is composed of a plurality of first sub-pixels emitting light of different colors. Each of the first sub-pixels is composed of a plurality of second sub-pixels emitting light of the same color. Each of the second sub-pixels includes: a first electrode; a second electrode above the first electrode; and a light-emitting layer between the first electrode and the second electrode.

17 Claims, 15 Drawing Sheets

(56) References Cited

U.S. PATENT DOCUMENTS

| | | |
|---|---|---|
| 2009/0284135 A1 | 11/2009 | Yoshida et al. |
| 2010/0259165 A1 | 10/2010 | Miura |
| 2011/0273080 A1 | 11/2011 | Kimura et al. |
| 2012/0139978 A1* | 6/2012 | Ikeda .................. G09G 3/3233 345/694 |
| 2012/0262055 A1 | 10/2012 | Miura |
| 2013/0002125 A1 | 1/2013 | Kimura et al. |
| 2013/0056768 A1 | 3/2013 | Miura |
| 2013/0105782 A1 | 5/2013 | Matsushima |
| 2013/0126839 A1 | 5/2013 | Matsushima |
| 2013/0140522 A1 | 6/2013 | Nishiyama |
| 2014/0014949 A1 | 1/2014 | Kimura et al. |

FOREIGN PATENT DOCUMENTS

| | | |
|---|---|---|
| JP | 2007-041560 | 2/2007 |
| JP | 2007-122033 | 5/2007 |
| JP | 2009-187957 | 8/2009 |
| JP | 2009-288735 | 12/2009 |
| JP | 2010-002530 | 1/2010 |
| JP | 2010-249892 | 11/2010 |
| JP | 2010-281890 | 12/2010 |

OTHER PUBLICATIONS

Form PCT/ISA/206 ("Invitation to pay additional fees and, where applicable, protest fee") from International Searching Authority (ISA) in International Patent Application No. PCT/JP2011/004379, dated Aug. 30, 2011.

Form PCT/IPEA/409 ("International Preliminary Report on Patentability") from International Preliminary Examining Authority (IPEA) in International Patent Application No. PCT/JP2011/004379, dated Nov. 15, 2013, together with an English language translation.

* cited by examiner

100

FIG. 8
(a) Transistor array (4K2K)
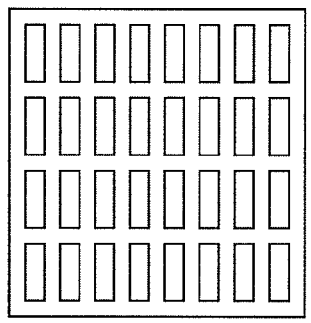
(b) Pixel electrodes (4K2K)
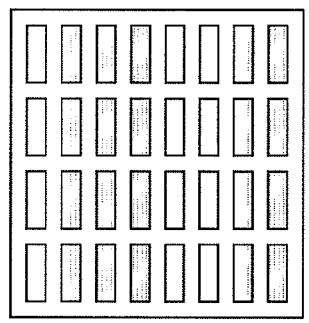
(c) Bank (4K2K)
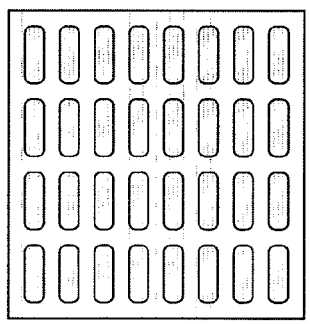
(d) Light-emitting layers (4K2K)
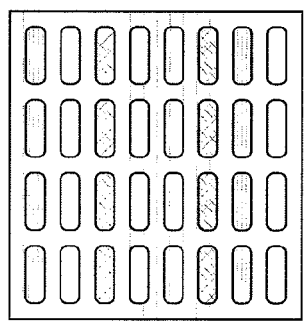

FIG. 9
(a) Transistor array (4K2K)
(b) Pixel electrodes (FHD)
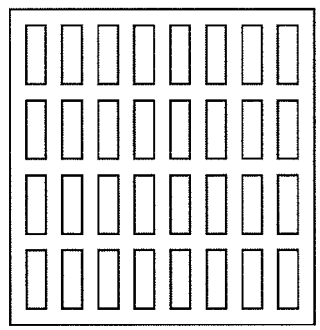
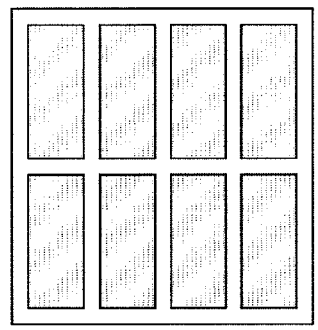
(c) Bank (FHD)
(d) Light-emitting layers (FHD)
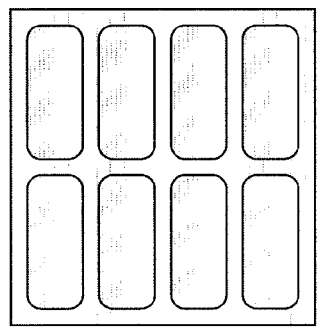
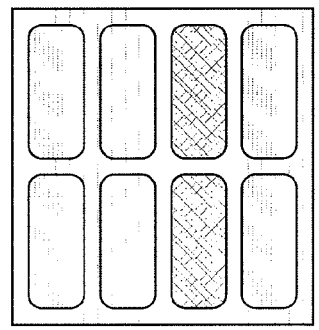

FIG. 10
(a) Transistor array (4K2K)
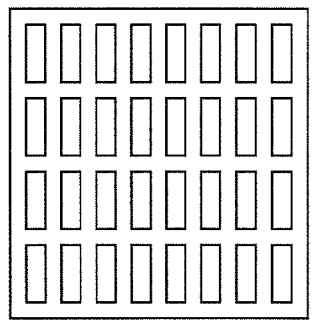
(b) Pixel electrodes (4K2K)
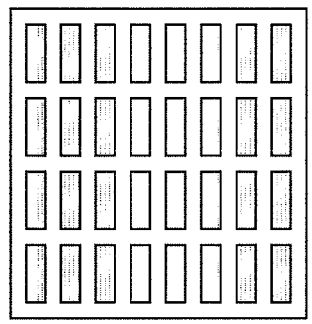
(c) Bank (FHD)
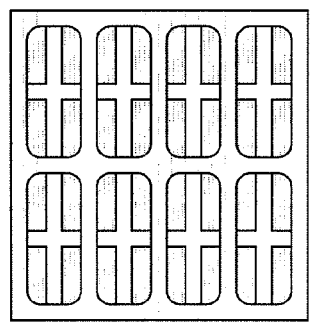
(d) Light-emitting layers (FHD)
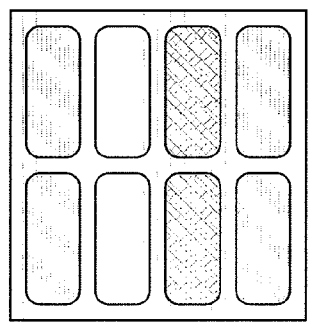

FIG. 11
(a) Transistor array (4K2K)
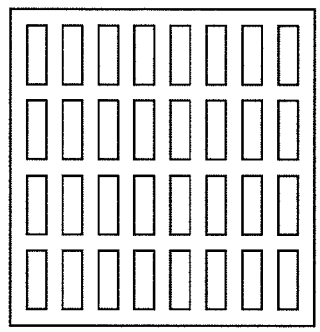
(b) Pixel electrodes (4K2K)
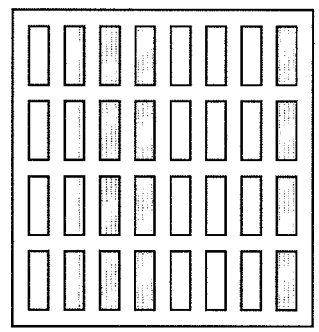
(c) Bank (4K2K)
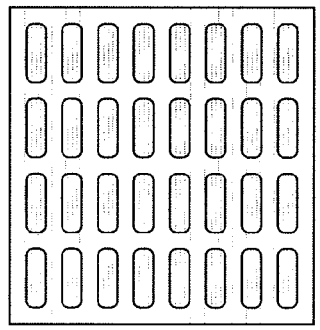
(d) Light-emitting layers (FHD)
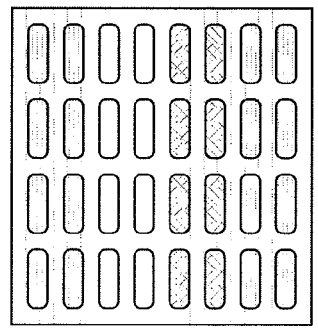

FIG. 12
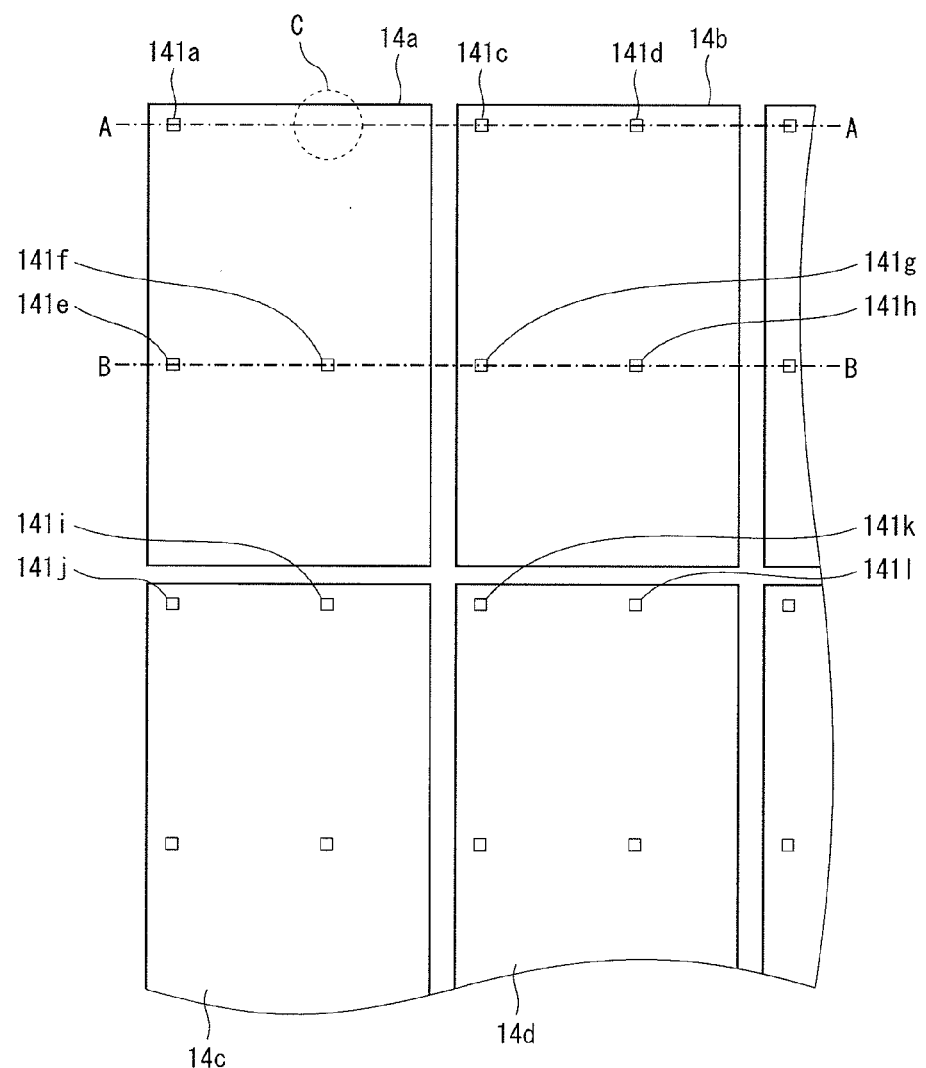
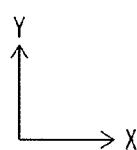

DISPLAY PANEL AND PRODUCTION METHOD FOR SAME

TECHNICAL FIELD

The present invention relates to a display panel, such as an organic electro-luminescence (EL) panel, and a method for manufacturing the same.

BACKGROUND ART

In recent years, organic EL panels making use of electro-luminescence in organic materials have been actively developed. An organic EL panel has a plurality of pixels arranged in a matrix of rows and columns. The number of pixels varies depending on resolution. For example, resolution of Full HD is 1920×1080, and resolution of 4K2K is approximately 4000×2000. Each pixel is composed of a plurality of sub-pixels emitting light of different colors. The colors of light are typically red (R), green (G), and blue (B). Full HD is currently popular as a standard for resolution of a digital television. As a next generation standard, 4K2K having a higher resolution than Full HD has been proposed. The number of pixels of 4K2K is approximately four times the number of pixels of Full HD.

Meanwhile, display panels can have display defects referred to as an unlit dot, a dark dot, and a bright dot. The unlit dot refers to a case where a light-emitting element in a sub-pixel is constantly off. The dark dot refers to a case where a light-emitting element in a sub-pixel constantly emits dim light. The bright dot refers to a case where a light-emitting element in a sub-pixel constantly emits bright light.

It is extremely difficult to reduce the number of display defects to zero in manufacturing the display panels. Thus, a display panel having some display defects is usually shipped as a non-defective product if the number and distribution of the display defects are within an allowable range. The allowable range for the display defects is defined for example in ISO13406-2.

CITATION LIST

Patent Literature

[Patent Literature 1]
Japanese Patent Application Publication No. 2010-281890

SUMMARY OF INVENTION

Technical Problem

As described above, since a display panel having some display defects that are within the allowable range is currently shipped as a non-defective product, a certain level of yield is secured. If a standard having a higher resolution is adopted in the future, however, the number of display defects is expected to increase due to a problem of processing accuracy and the like, and the number of cases where display defects are not within the allowable range is expected to increase. This can reduce yield of display panels, and increase manufacturing costs.

To address the above-mentioned problem, the present invention aims to provide technology for suppressing reduction in yield of display panels.

Solution to Problem

A display panel pertaining to one aspect of the present invention is a display panel having a plurality of pixels arranged in a matrix of rows and columns, wherein each of the pixels is composed of a plurality of first sub-pixels emitting light of different colors, each of the first sub-pixels is composed of a plurality of second sub-pixels emitting light of the same color, and each of the second sub-pixels includes: a first electrode; a second electrode above the first electrode; and a light-emitting layer between the first electrode and the second electrode.

Advantageous Effects of Invention

Even when one of the second sub-pixels included in one of the first sub-pixels has a display defect, the first sub-pixel operates normally if the remaining second sub-pixels included in the first sub-pixel operate normally. Thus, even if the display defect is not within the allowable range in a display panel having the second sub-pixels as its sub-pixels, and manufactured in accordance with a standard having a high resolution, the display defect is likely to be within the allowable range in a display panel having, as its sub-pixels, the first sub-pixels each composed of the second sub-pixels, and manufactured in accordance with a standard having a low resolution. During manufacturing of the display panel in accordance with the standard having the high resolution, the display panel is inspected for any display defect. When the display defect is not within the allowable range, the standard in accordance with which the display panel is manufactured is switched to the standard having the low resolution, and the display panel is thereafter manufactured in accordance with the standard having the low resolution. Reduction in manufacturing yield can thus be suppressed. Since the display panel pertaining to one aspect of the present invention can be manufactured in the above-mentioned manufacturing process, reduction in manufacturing yield can be suppressed.

BRIEF DESCRIPTION OF DRAWINGS

FIG. 8 is a schematic diagram showing the manufacturing process shown in FIG. 7.

FIG. 9 is a schematic diagram showing the manufacturing process shown in FIG. 7.

FIG. 10 is a schematic diagram showing the manufacturing process shown in FIG. 7.

FIG. 11 is a schematic diagram showing the manufacturing process shown in FIG. 7.

FIG. 12 is a plan view showing a layout of pixel electrodes.

DESCRIPTION OF EMBODIMENTS

Figure 1:
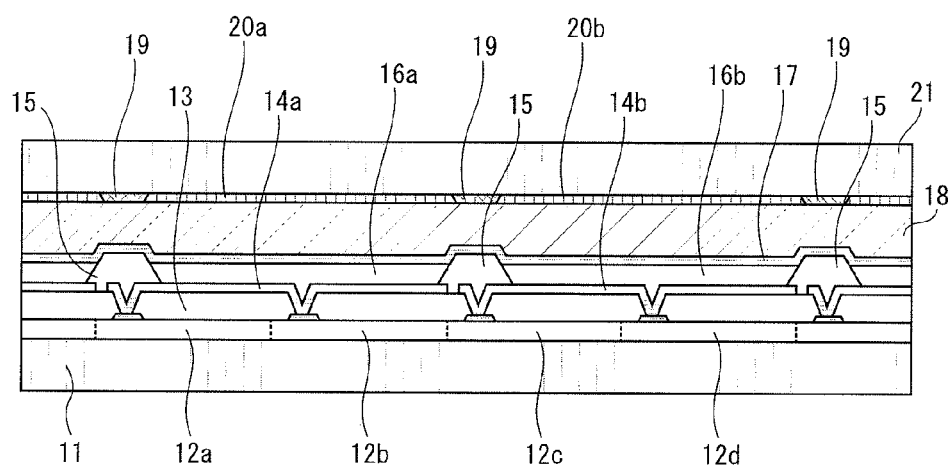
FIG. 1 is a local sectional view of an organic EL panel according to one embodiment of the present invention.

[Overview of One Aspect of the Present Invention]

A display panel pertaining to one aspect of the present invention is a display panel having a plurality of pixels arranged in a matrix of rows and columns, wherein each of the pixels is composed of a plurality of first sub-pixels emitting light of different colors, each of the first sub-pixels is composed of a plurality of second sub-pixels emitting light of the same color, and each of the second sub-pixels includes: a first electrode; a second electrode above the first electrode; and a light-emitting layer between the first electrode and the second electrode.

Even when one of the second sub-pixels included in one of the first sub-pixels has a display defect, the first sub-pixel operates normally if the remaining second sub-pixels included in the first sub-pixel operate normally. Thus, even if the display defect is not within the allowable range in a display panel having the second sub-pixels as its sub-pixels, and manufactured in accordance with a standard having a high resolution, the display defect is likely to be within the allowable range in a display panel having, as its sub-pixels, the first sub-pixels each composed of the second sub-pixels, and manufactured in accordance with a standard having a low resolution. During manufacturing of the display panel in accordance with the standard having the high resolution, the display panel is inspected for any display defect. When the display defect is not within the allowable range, the standard in accordance with which the display panel is manufactured is switched to the standard having the low resolution, and the display panel is thereafter manufactured in accordance with the standard having the low resolution. Reduction in manufacturing yield can thus be suppressed. Since the display panel pertaining to one aspect of the present invention can be manufactured in the above-mentioned manufacturing process, reduction in manufacturing yield can be suppressed.

The display panel may be one of an active matrix display panel and a passive matrix display panel.

The display panel may be the active matrix display panel, and each of the second sub-pixels may further include a pixel circuit configured to feed power to the first electrode.

The first electrode may be a pixel electrode provided individually for each of the second sub-pixels, and the second electrode may be a part, above the pixel electrode, of a common electrode provided to extend across the plurality of pixels.

The first electrode may be a part of a pixel electrode provided individually for each of the first sub-pixels, and the second electrode may be a part, above the part of the pixel electrode, of a common electrode provided to extend across the plurality of pixels.

At least one of the first sub-pixels may include at least one second sub-pixel having a display defect.

The display defect may be attributed to a defect of the pixel circuit, in each second sub-pixel not having the display defect, the pixel circuit may be electrically connected to the first electrode, and in each second sub-pixel having the display defect, the pixel circuit may be electrically disconnected from the first electrode.

The pixel circuit may include a thin-film transistor element.

The display defect may be at least one of an unlit dot and a dark dot.

The display panel may be the passive matrix display panel, wherein a plurality of belt-shaped row-direction electrode wires arranged in rows and a plurality of belt-shaped column-direction electrode wires arranged in columns may cross each other to form crossing regions, the first electrode may be each of regions of the row-direction electrode wires corresponding to the crossing regions, and the second electrode may be each of regions of the column-direction electrode wires corresponding to the crossing regions.

The number of the second sub-pixels may be an integer multiple of the number of the first sub-pixels.

The plurality of second sub-pixels included in each of the first sub-pixels may be arranged adjacently.

The plurality of second sub-pixels included in each of the first sub-pixels may be arranged separately with a second sub-pixel emitting light of a different color therebetween.

A method for manufacturing a display panel pertaining to another aspect of the present invention is a method for manufacturing a display panel, the method comprising: preparing a substrate; and forming, on the substrate, a plurality of pixels arranged in a matrix of rows and columns, wherein the forming of the pixels includes forming, for each of the pixels, a plurality of first sub-pixels emitting light of different colors, the forming of the first sub-pixels includes forming, for each of the first sub-pixels, a plurality of second sub-pixels emitting light of the same color, and the forming of the second sub-pixels includes: forming a first electrode; foaming a second electrode above the first electrode; and forming a light-emitting layer between the first electrode and the second electrode.

A method for manufacturing a display panel pertaining to yet another aspect of the present invention is a method for manufacturing a display panel, the method comprising: preparing a substrate; and forming, on the substrate, a plurality of pixels arranged in a matrix of rows and columns, wherein the preparing of the substrate includes: forming a thin-film transistor array substrate including pixel circuits arranged in a matrix of rows and columns, each of the pixel circuits including a thin-film transistor element; and after forming the thin-film transistor array substrate, inspecting the thin-film transistor array substrate for any display defect, and the forming of the pixels includes: when the display defect found in the inspecting of the thin-film transistor array substrate is not within an allowable range, forming pixel electrodes such that one pixel electrode is allocated to each group of pixel circuits, the number of the pixel circuits included in each group being an integer equal to or greater than two; forming light-emitting layers on the respective pixel electrodes; and forming, on the light-emitting layers, a common electrode to extend across the plurality of pixels.

In the forming of the pixel electrodes, an area of each of the pixel electrodes may be an integer multiple of an area of each of the pixel circuits, the integer being equal to or greater than two.

The preparing of the substrate may further include, after forming the thin-film transistor array substrate and before inspecting the thin-film transistor array substrate, forming an insulation film on the thin-film transistor array substrate, the insulation film having contact holes.

A method for manufacturing a display panel pertaining to yet another aspect of the present invention is a method for manufacturing a display panel, the method comprising: preparing a substrate; and forming, on the substrate, a plurality of pixels arranged in a matrix of rows and columns, wherein the preparing of the substrate includes: forming a thin-film transistor array substrate including pixel circuits arranged in a matrix of rows and columns, each of the pixel circuits including a thin-film transistor element; and forming an insulation film on the thin-film transistor array substrate, the insulation film having contact holes, the forming of the pixels includes: forming, on the insulation film, pixel electrodes such that one pixel electrode is allocated to each of the pixel circuits; inspecting the pixel electrodes for any defect; forming, on the insulation film, a partition wall having apertures; forming light-emitting layers on one or more pixel electrodes in the respective apertures; and forming, on the light-emitting layers, a common electrode to extend across the plurality of pixels, and in the forming of the partition wall, when the display defect found in the inspecting of the pixel electrodes is not within an allowable range, forming the apertures such that one aperture is allocated to each group of pixel electrodes, the number of the pixel electrodes included in each group being an integer equal to or greater than two.

In forming of the partition wall, an area of each of the apertures may be an integer multiple of an area of each of the pixel electrodes, the integer being equal to or greater than two.

A method for manufacturing a display panel pertaining to yet another aspect of the present invention is a method for manufacturing a display panel, the method comprising: preparing a substrate; and forming, on the substrate, a plurality of pixels arranged in a matrix of rows and columns, wherein the preparing of the substrate includes: forming a thin-film transistor array substrate including pixel circuits arranged in a matrix of rows and columns, each of the pixel circuits including a thin-film transistor element; and forming an insulation film on the thin-film transistor array substrate, the insulation film having contact holes, the forming of the pixels includes: forming, on the insulation film, pixel electrodes such that one pixel electrode is allocated to each of the pixel circuits; forming, on the insulation film, a partition wall having apertures provided for the respective pixel electrodes; inspecting the pixel electrodes or the partition wall for any defect; forming light-emitting layers on the respective pixel electrodes in the apertures; and forming, on the light-emitting layers, a common electrode to extend across the plurality of pixels, and in forming of the light-emitting layers, when the defect found in the inspecting of the pixel electrodes or the partition wall is not within an allowable range, light-emitting layers emitting light of the same color are formed in apertures in the same unit, and light-emitting layers emitting light of different colors are formed in apertures in different units, each unit being composed of a plurality of adjacent apertures.

[Structure of Organic EL Panel]

The following describes an organic EL panel making use of four sub-pixels in a standard having a high resolution (e.g. 4K2K) as one sub-pixel in a standard having a low resolution (e.g. Full HD).

FIG. 1 is a local sectional view of an organic EL panel according to one embodiment of the present invention.

The organic EL panel 100 includes a first substrate 11, TFT layers 12a to 12d, an interlayer insulation film 13, pixel electrodes 14a and 14b, a partition wall 15, light-emitting layers 16a and 16b, a common electrode 17, a sealing layer 18, a black matrix 19, color filters 20a and 20b, and a second substrate 21.

Different alphabetical letters included in reference signs assigned to the respective TFT layers indicate that the TFT layers have the same structure but belong to different sub-pixels. Hereinafter, when the TFT layers are not distinguished from one another, the TFT layers are each simply referred to as a "TFT layer 12". The same applies to the pixel electrodes, the light-emitting layers, and the color filters.

<First Substrate>

The first substrate 11 is made of an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

<TFT Layer>

The TFT layer 12 is provided for each sub-pixel in 4K2K. On the TFT layer 12, a pixel circuit including a thin-film transistor element is fowled. On a top surface of the TFT layer 12, an extraction electrode electrically connected to the pixel circuit is formed. The first substrate 11 on which the TFT layers 12 have been formed is also referred to as a thin-film transistor array substrate.

<Interlayer Insulation Film>

The interlayer insulation film 13 is composed, for example, of a passivation film formed on the TFT layers 12, and a planarization film formed on the passivation film. The passivation film is a thin film made of silicon oxide (SiO) or silicon nitride (SiN). The passivation film covers the TFT layers and the extraction electrodes for protection. The planarization film is made of an insulating material such as a polyimide resin and an acrylic resin. The planarization film planarizes an uneven top surface of the passivation film. A contact hole is formed in a part of the interlayer insulation film 13 on each of the extraction electrodes, so that a top surface of the extraction electrode is partially exposed from the contact hole.

<Pixel Electrode>

The pixel electrode 14 is provided individually for each sub-pixel in Full HD. The pixel electrode 14 enters the contact hole provided in the interlayer insulation film 13 so as to electrically connect to the extraction electrode. The pixel electrode 14 is made, for example, of a light reflective conductive material such as Ag (silver), APC (alloy of silver, palladium, and copper), ARA (alloy of silver, rubidium and, gold), MoCr (alloy of molybdenum and chromium), or NiCr (alloy of nickel and chromium).

<Partition Wall>

The partition wall (also referred to as a "bank") 15 is formed on the pixel electrodes, and has an aperture provided for each sub-pixel in Full HD. The partition wall 15 is made, for example, of an organic material having an insulating property (e.g. an acrylic resin, a polyimide resin, and a novolac type phenolic resin). The partition wall 15 functions as a structure for preventing an overflow of applied ink when the light-emitting layer is formed by application of ink, and as a structure for placing a deposition mask when the light-emitting layer is formed by deposition.

<Light-emitting Layer>

The light-emitting layer 16 is formed in each of the apertures of the partition wall 15, and is thus formed for each sub-pixel in Full HD. The light-emitting layer 16 at least includes an organic light-emitting layer, and further includes a hole injection layer, a hole transport layer, an electron injection layer, and an electron transport layer as necessary. The organic light-emitting layer is made, for example, of a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

<Common Electrode>

The common electrode 17 is provided to be shared by, and to extend across, all pixels. The common electrode 17 is made, for example, of a light-transmissive material such as indium tin oxide (ITO) and indium zinc oxide (IZO).

<Sealing Layer>

The sealing layer 18 is formed on the common electrode 17. The sealing layer 18 protects the light-emitting layers 16 from moisture and oxygen.

<Black Matrix>

The black matrix 19 is a black resin layer formed for the purpose of preventing external light from entering into the panel, preventing internal components from being seen through the substrate 21, and suppressing reflection of external light to improve contrast of the organic EL panel 100. The black matrix 19 is made, for example, of an ultraviolet curing resin material including a black pigment having an excellent light absorption property and light blocking effect.

<Color Filter>

The color filter 20 is provided for each sub-pixel in Full HD. The color filter 20 transmits visible light having a wavelength corresponding to each of R, G, and B. The color filter 20 is made, for example, of a well-known resin material (e.g. a color resist manufactured by JSR Corporation, which is commercially available).

<Second Substrate>

As with the first substrate 11, the second substrate 21 is made of an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

[Layout of Layers]

The following describes a layout of the TFT layers 12, the pixel electrodes 14, the partition wall 15, and the light-emitting layers 16.

Figure 2:
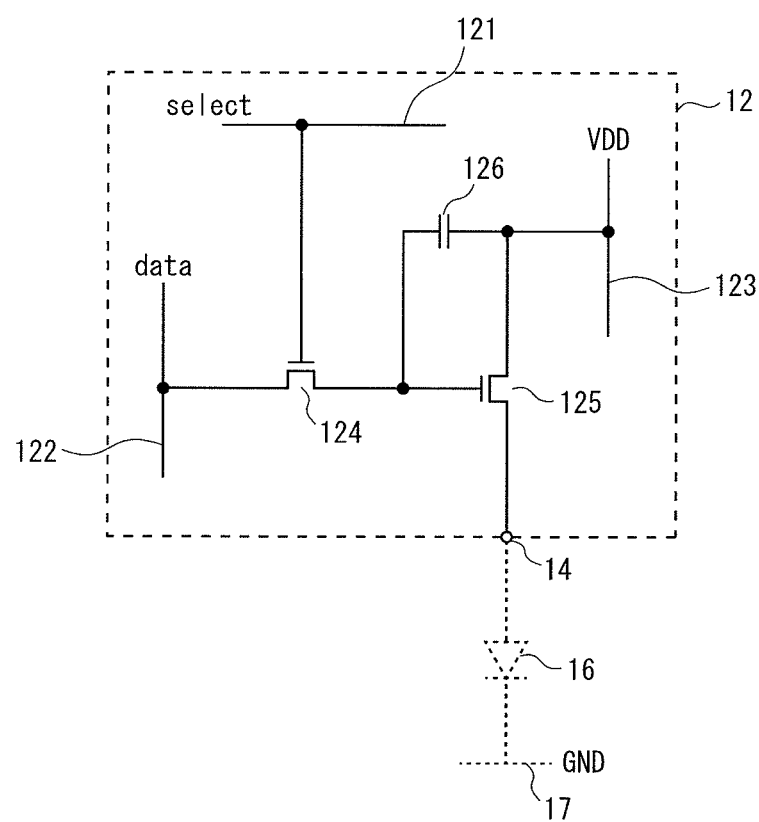
FIG. 2 is a circuit diagram showing a pixel circuit formed on a TFT layer.

FIG. 2 is a circuit diagram showing an example of the pixel circuit formed on the TFT layer. As shown in FIG. 2, the pixel circuit includes a gate line 121, a data line 122, a power line 123, a switching transistor 124, a driving transistor 125, and a holding capacitor 126. The switching transistor 124 and the driving transistor 125 are each a thin-film transistor element.

Figure 3:
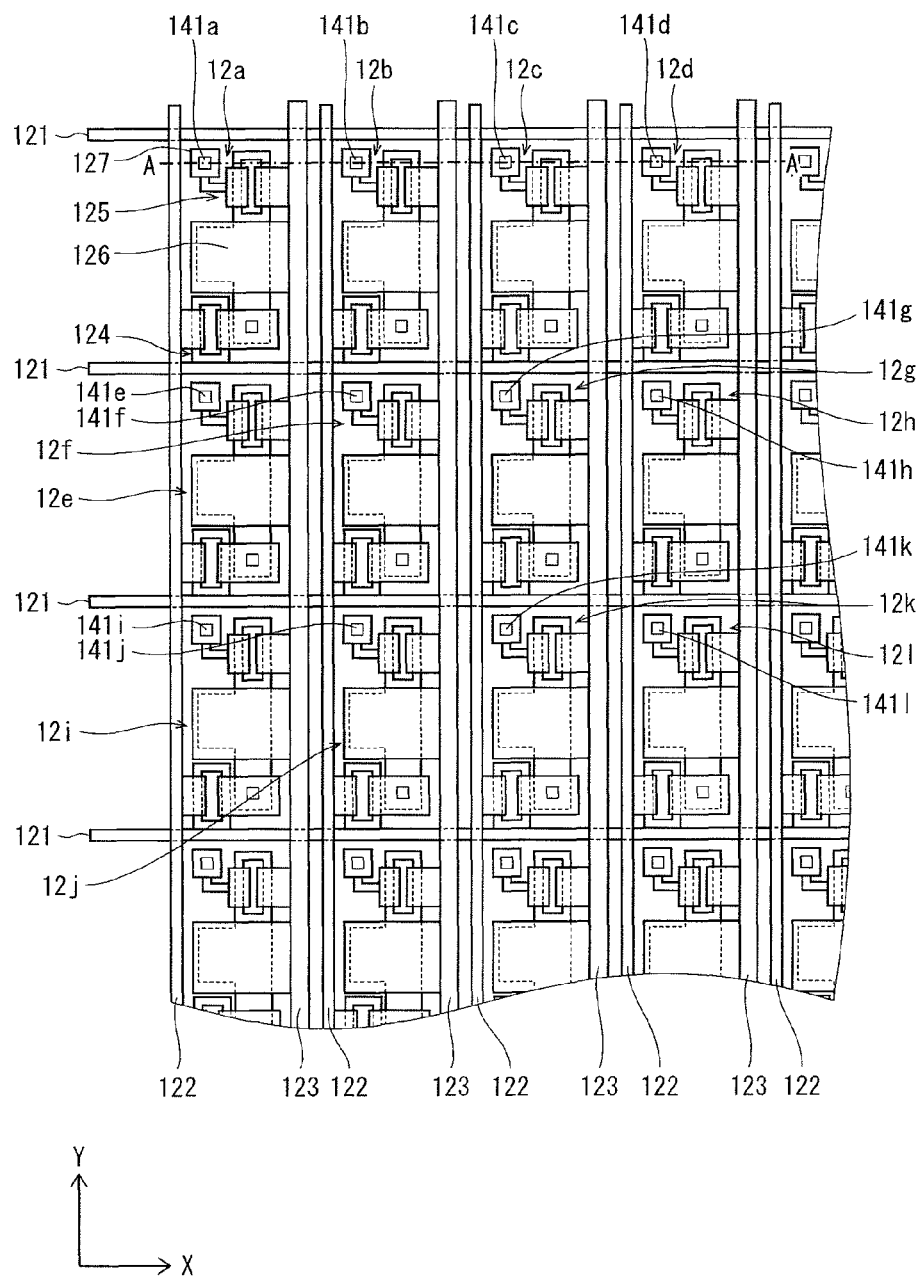
FIG. 3 is a plan view showing a layout of TFT layers.

FIG. 3 is a plan view showing a layout of the TFT layers. A sectional view taken along the line A-A of FIG. 3 corresponds to FIG. 1. TFT layers 12a to 12l are formed in respective regions arranged in a matrix of rows (X direction) and columns (Y direction). A size of each of the regions is determined by a size and resolution of the organic EL panel. The TFT layers 12 are formed in accordance with 4K2K. A row direction size and a column direction size of each of the regions are approximately 50 μm and approximately 150 μm, respectively.

As shown in FIG. 3, the gate line 121 is provided for each row, and the data line 122 and the power line 123 are provided for each column. In each region defined in 4K2K, one TFT layer 12 is formed. When attention is focused on the TFT layer 12a, it is found that the switching transistor 124, the driving transistor 125, and the holding capacitor 126 are formed together in one region. A source/drain electrode of the driving transistor 125 is electrically connected to an extraction electrode 127, and the extraction electrode 127 is electrically connected to the pixel electrode via a contact portion 141a.

Figure 4:
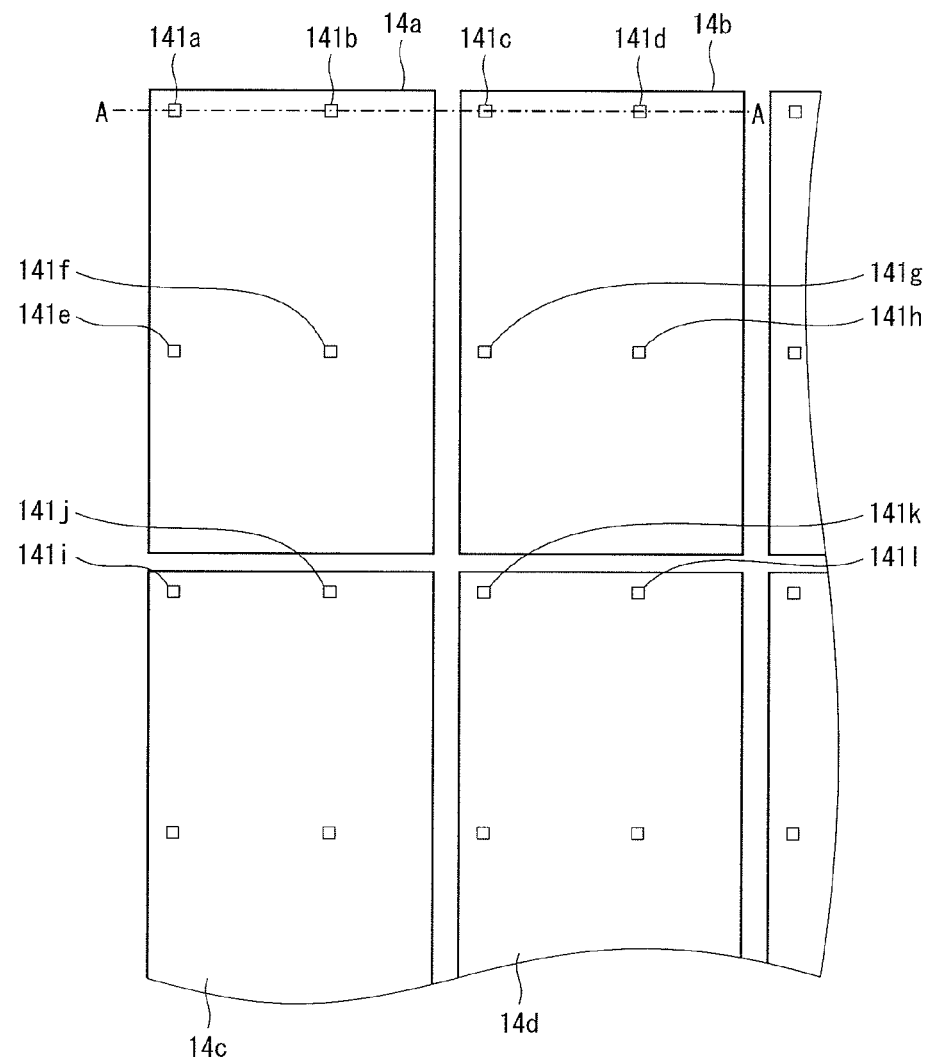
FIG. 4 is a plan view showing a layout of pixel electrodes.

FIG. 4 is a plan view showing a layout of pixel electrodes. Pixel electrodes 14a to 14d are formed in respective regions arranged in a matrix of rows (X direction) and columns (Y direction). The pixel electrodes 14 are formed in accordance with Full HD. A row direction size and a column direction size of each of the regions are approximately 100 μm and approximately 300 μm, respectively. When attention is focused on the pixel electrode 14a, the pixel electrode 14a is electrically connected to the TFT layers 12a, 12b, 12e, and 12f via contact portions 141a, 141b, 141e, and 141f, respectively. That is to say, power is supplied to the pixel electrode 14a from the four TFT layers 12a, 12b, 12e, and 12f.

Figure 5:
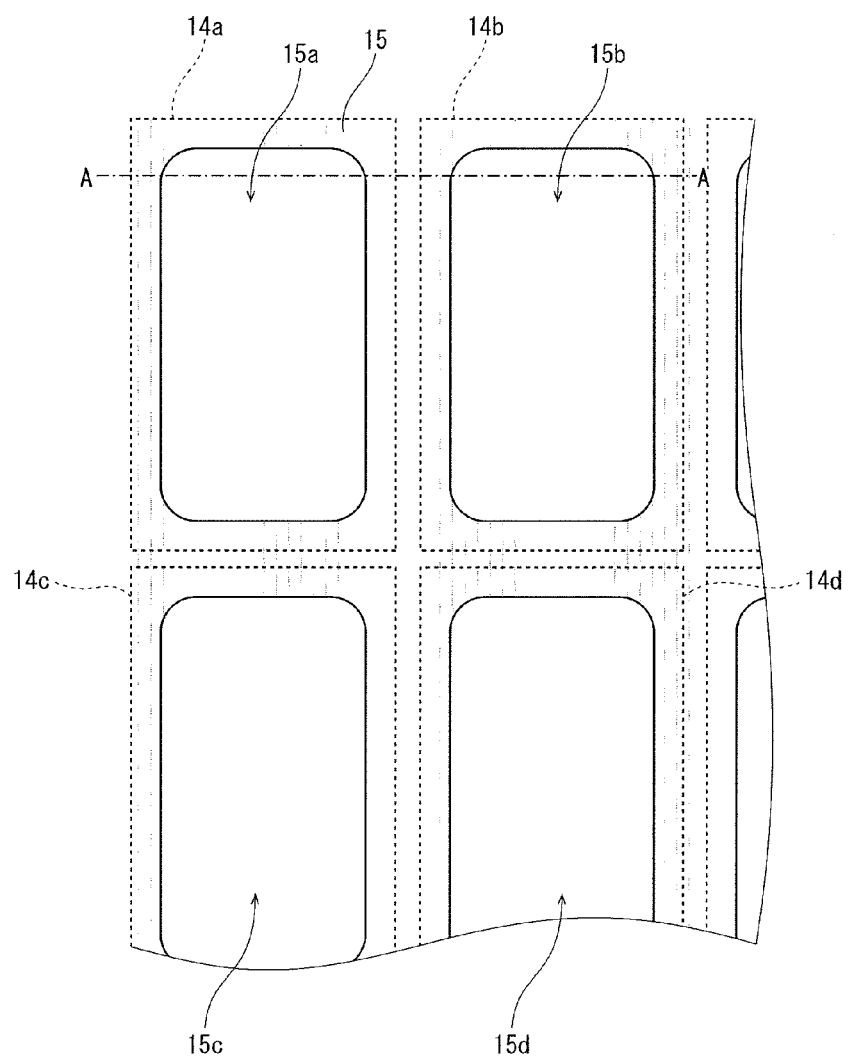
FIG. 5 is a plan view showing a layout of a partition wall.

FIG. 5 is a plan view showing a layout of the partition wall. The partition wall 15 has apertures 15a to 15d arranged in a matrix of rows (X direction) and columns (Y direction). The apertures 15a to 15d are formed in accordance with Full HD. A row direction size and a column direction size of each of the apertures are approximately 70 μm and approximately 210 μm, respectively.

Figure 6:
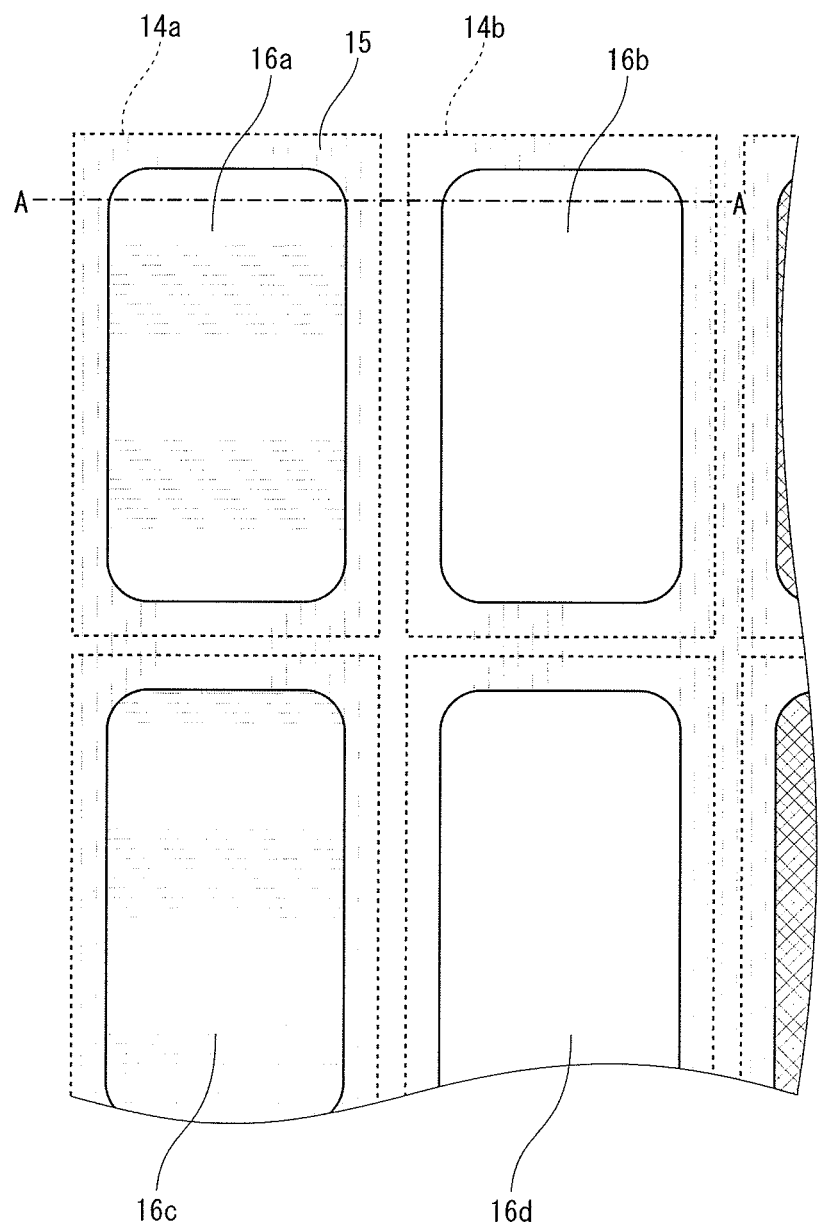
FIG. 6 is a plan view showing a layout of light-emitting layers.

FIG. 6 is a plan view showing a layout of the light-emitting layers. Light-emitting layers 16a to 16d are provided in respective apertures of the partition wall. Since the apertures of the partition wall are formed in accordance with Full HD, the light-emitting layers are also formed in accordance with Full HD. Light-emitting layers adjacent to each other in a column direction (e.g. the light-emitting layers 16a and 16c) emit light of the same color, and light-emitting layers adjacent to each other in a row direction (e.g. the light-emitting layers 16a and 16b) emit light of different colors.

As described above, in the present embodiment, the TFT layers 12 are formed in accordance with 4K2K, while layers above the TFT layer 12, i.e. the pixel electrodes 14, the partition wall 15, and the light-emitting layers 16, are formed in accordance with Full HD. One light-emitting layer 16 is driven by four TFT layers 12. This means that one sub-pixel in Full HD is composed of four sub-pixels in 4K2K emitting light of the same color. Thus, the number of sub-pixels in Full HD is a quarter of the number of sub-pixels in 4K2K. In other words, the number of sub-pixels in 4K2K is an integer (four) multiple of the number of sub-pixels in Full HD.

According to the above-mentioned structure, even when one of four TFT layers has a display defect, a light-emitting layer connected to the TFT layers emits light normally if the remaining three TFT layers operate normally. Thus, even if the display defect is not within the allowable range in 4K2K, the display defect is likely to be within the allowable range in Full HD. During manufacturing of an organic EL panel in accordance with 4K2K, the organic EL panel is inspected for any display defect. When the display defect is not within the allowable range, the standard in accordance with which the organic EL panel is manufactured is switched to Full HD, and the organic EL panel is thereafter manufactured in accordance with Full HD. Reduction in manufacturing yield can thus be suppressed.

The display defect can occur not only during manufacturing process but also after product shipment due to aged deterioration. In such a case, even when one of four TFT layers deteriorates, a light-emitting layer connected to the TFT layers emits light normally if the remaining three TFT layers operate normally. As a result, a product life can be extended.

When the standard in accordance with which the organic EL panel is manufactured is switched from 4K2K to Full HD, four TFT layers composed of two TFT layers adjacent to each other in the row direction and other two TFT layers adjacent to the respective two TFT layers in the column direction should be driven at the same time in a similar manner. For example, two rows of the gate lines 121 adjacent to each other should be provided with an ON signal, and two columns of the data lines 122 adjacent to each other should be provided with the same data signal. As a result, it is possible to cause four sub-pixels in 4K2K to function as one sub-pixel in Full HD.

[Method for Manufacturing Organic EL Panel]

Figure 7:
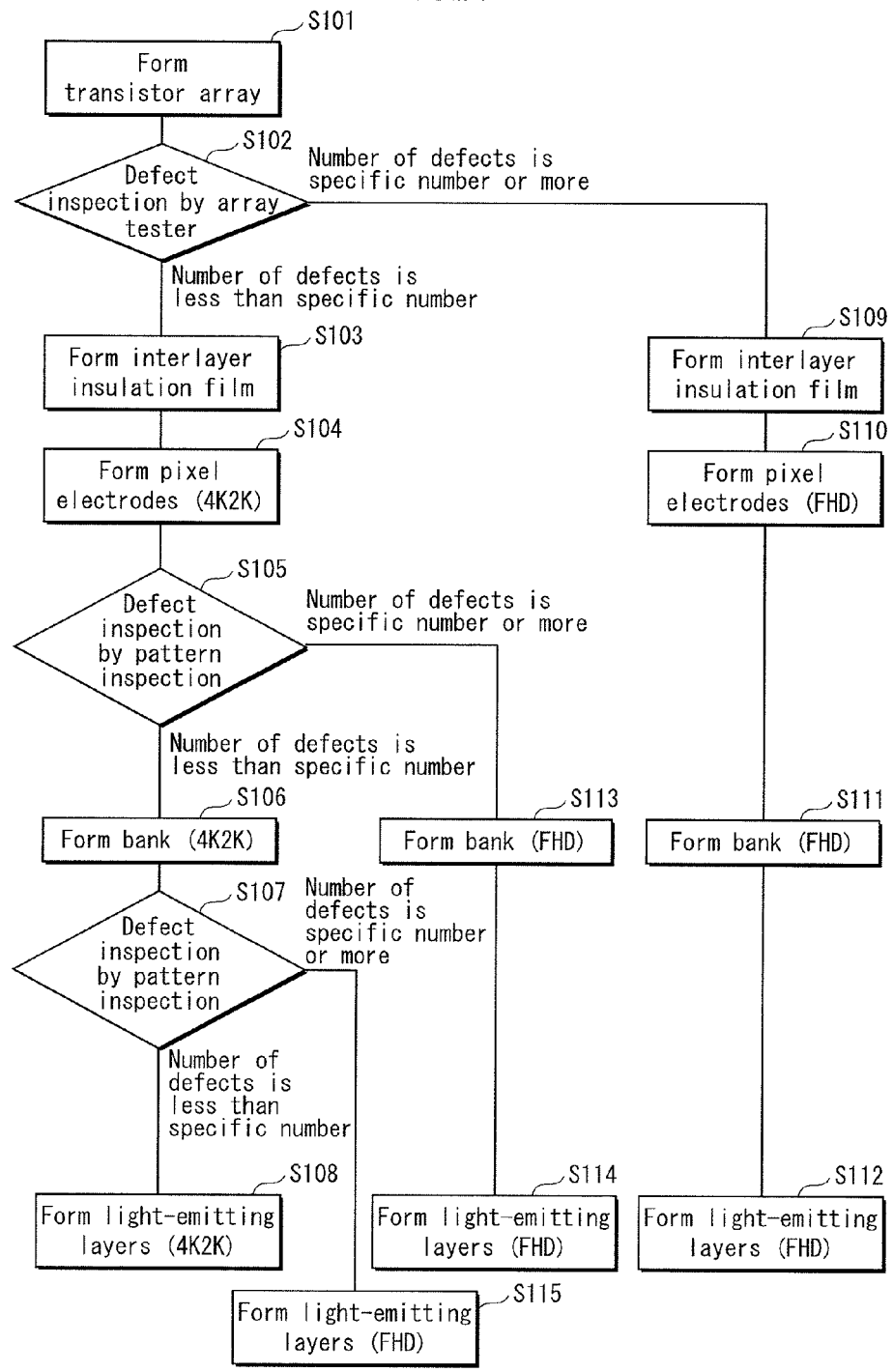
FIG. 7 is a flow chart showing manufacturing processes of the organic EL panel according to the embodiment of the present invention.

FIG. 7 is a flow chart showing a manufacturing process of the organic EL panel according to the embodiment of the present invention.

First, the TFT layers 12 are formed on the substrate 11 in accordance with 4K2K to form a thin-film transistor array substrate (step S101).

Next, the thin-film transistor array substrate is inspected for any display defect by using an array tester (step S102). For example, the thin-film transistor element is inspected to see whether the thin-film transistor element has an anomalous electric property or not. When the display defect found in the inspection is within the allowable range, an interlayer insulation film is formed on the thin-film transistor array substrate (step S103), and pixel electrodes are then formed in accordance with 4K2K (step S104).

Then, the pixel electrodes are inspected for any display defect by pattern inspection (step S105). For example, the pixel electrodes are inspected to see whether adjacent pixel electrodes might not be joined to each other, whether there is any pixel electrode on which a foreign contaminant exists, and whether there is any pixel electrode having a defective shape. When the display defect found in the inspection is within the allowable range, a partition wall is then formed in accordance with 4K2K (step S106).

Then, the partition wall is inspected for any display defect by pattern inspection (step S107). For example, the partition wall is inspected to see whether there is any aperture of the partition wall in which a foreign contaminant exists, and whether there is any aperture of the partition wall having a defective shape. When the display defect found in the inspection is within the allowable range, light-emitting layers are then formed in accordance with 4K2K (step S108).

On the other hand, when the display defect found in the inspection of step S102 is not within the allowable range, an interlayer insulation film is formed on the thin-film transistor array substrate (step S109), and pixel electrodes are then formed in accordance with Full HD (step S110). That is to say, in a process of forming the pixel electrodes, the pixel electrodes are formed such that one pixel electrode is allocated to four TFT layers. An area of each of the pixel electrodes in Full HD is approximately four times larger than an area of each of the pixel electrodes in 4K2K. Thus, an area of one pixel electrode is approximately the same as a total area of four TFT layers. The interlayer insulation film should be formed in a similar manner in 4K2K and in Full HD. The partition wall is then formed in accordance with Full HD (step S111), and the light-emitting layers are formed in accordance with Full HD (step S112).

When the display defect found in the inspection in step S105 is not within the allowable range, the partition wall is formed in accordance with Full HD on the pixel electrodes formed in accordance with 4K2K (step S113), and the light-emitting layers are then formed in accordance with Full HD (step S114). That is to say, in a process of forming the partition wall, the apertures are formed such that one aperture is allocated to four pixel electrodes. An area of each of the apertures in Full HD is approximately four times larger than an area of each of the apertures in 4K2K. Thus, an area of one aperture is approximately the same as a total area of four pixel electrodes.

When the display defect found in the inspection in step S107 is not within the allowable range, the light-emitting layers are formed in accordance with Full HD on the partition wall formed in accordance with 4K2K (step S 115). That is to say, in a process of forming the light-emitting layers, the light-emitting layers are formed such that four light-emitting layers composed of two light-emitting layers adjacent to each other in the row direction and other two light-emitting layers adjacent to the respective two light-emitting layers in the column direction emit light of the same color.

As described above, during manufacturing of the organic EL panel in accordance with 4K2K, the organic EL panel is inspected for any display defect three times. When the display defect found in the inspection is within the allowable range every time, manufacturing of the organic EL panel is completed in accordance with 4K2K. When the display defect found in the inspection is not within the allowable range at least once, the standard in accordance with which the organic EL panel is manufactured is switched to Full HD, and the organic EL panel is thereafter manufactured in accordance with Full HD. The reduction in manufacturing yield can thus be suppressed.

In the present embodiment, the manufacturing process of the organic EL panel varies depending on the result of the inspection for any display defect. Thus, the structure of the resulting organic EL panel also varies. FIGS. 8, 9, 10, and 11 schematically show organic EL panels manufactured in different manufacturing processes.

Specifically, FIG. 8 shows an organic EL panel manufactured as a result of determining that the display defect is within the allowable range in each of steps S102, S105, and S107 of FIG. 7, and eventually reaching step S108 of FIG. 7.

FIG. 9 shows an organic EL panel manufactured as a result of determining that the display defect is not within the allowable range in step S102 of FIG. 7, and eventually reaching step S112 of FIG. 7. The organic EL panel described with use of FIGS. 1 to 6 has been manufactured in this manufacturing process. In this case, one sub-pixel in Full HD is composed of four TFT layers in 4K2K, one pixel electrode in Full HD, and one light-emitting layer in Full HD.

FIG. 10 shows an organic EL panel manufactured as a result of determining that the display defect is not within the allowable range in step S105 of FIG. 7, and eventually reaching step S114 of FIG. 7. In this case, one sub-pixel in Full HD is composed of four TFT layers in 4K2K, four pixel electrodes in 4K2K, and one light-emitting layer in Full HD.

FIG. 11 shows an organic EL panel manufactured as a result of determining that the display defect is not within the allowable range in step S107 of FIG. 7, and eventually reaching step S115 of FIG. 7. In this case, one sub-pixel in Full HD is composed of four TFT layers in 4K2K, four pixel electrodes in 4K2K, and four light-emitting layers in 4K2K.

[Modifications]

(1) Handling of TFT Layer having Display Defect

Figure 13A:
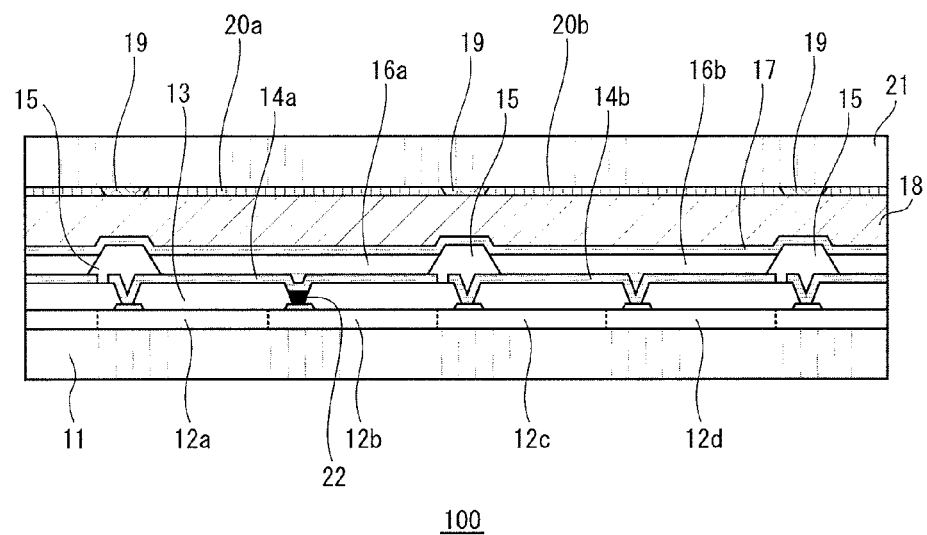
FIG. 13A is a local sectional view of an organic EL panel of FIG. 12 taken along the line A-A of FIG. 12.
Figure 13B:
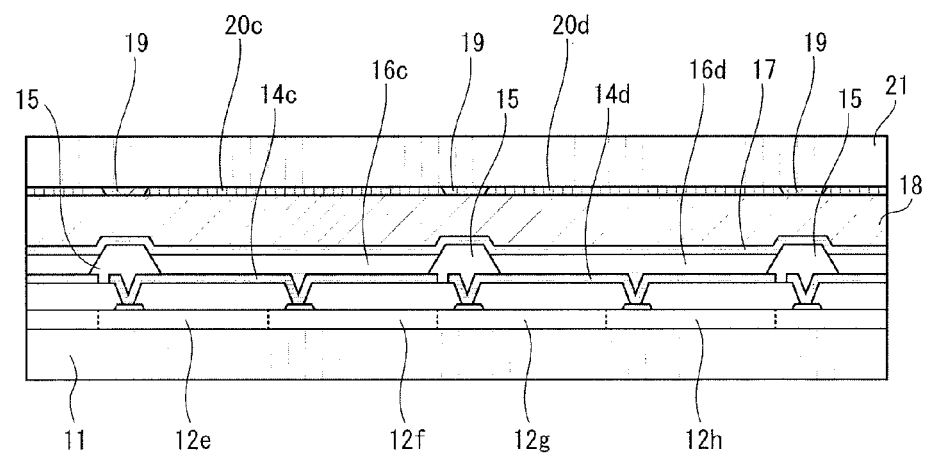
FIG. 13B is a local sectional view of the organic EL panel of FIG. 12 taken along the line B-B of FIG. 12.

In the above-mentioned embodiment, each of the TFT layers is electrically connected to the pixel electrode, regardless of whether or not the TFT layer has any display defect. This simplifies the manufacturing process, as no extra step for electrically disconnecting the TFT layer having the display defect from the pixel electrode is needed. The present invention, however, is not limited to this structure. The TFT layer having any display defect may electrically be disconnected from the pixel electrode. FIG. 12 is a plan view showing a layout of the pixel electrodes. FIG. 13A is a sectional view of an organic EL panel of FIG. 12 taken along the line A-A of FIG. 12, and FIG. 13B is a sectional view of the organic EL panel of FIG. 12 taken along the line B-B of FIG. 12. Assume, in this example, that the TFT layer 12b has a display defect. By inserting an insulating material 22 between the pixel electrode 14a and the extraction electrode formed on the TFT layer 12b, the TFT layer 12b and the pixel electrode 14a are electrically disconnected from each other. This is achieved for example by injecting the insulating material into an intended contact hole by using a dispenser after the interlayer insulation film 13 is formed. By electrically disconnecting the TFT layer having any display defect from the pixel electrode as described above, an adverse effect of the TFT layer having the display defect on brightness can be reduced. A method for electrically disconnecting the TFT layer having the display defect from the pixel electrode is not limited to the method described above, and a specific wiring pattern on the TFT layer may be burned off with a laser.

(2) Thin-film Transistor Array Substrate

Figure 14:
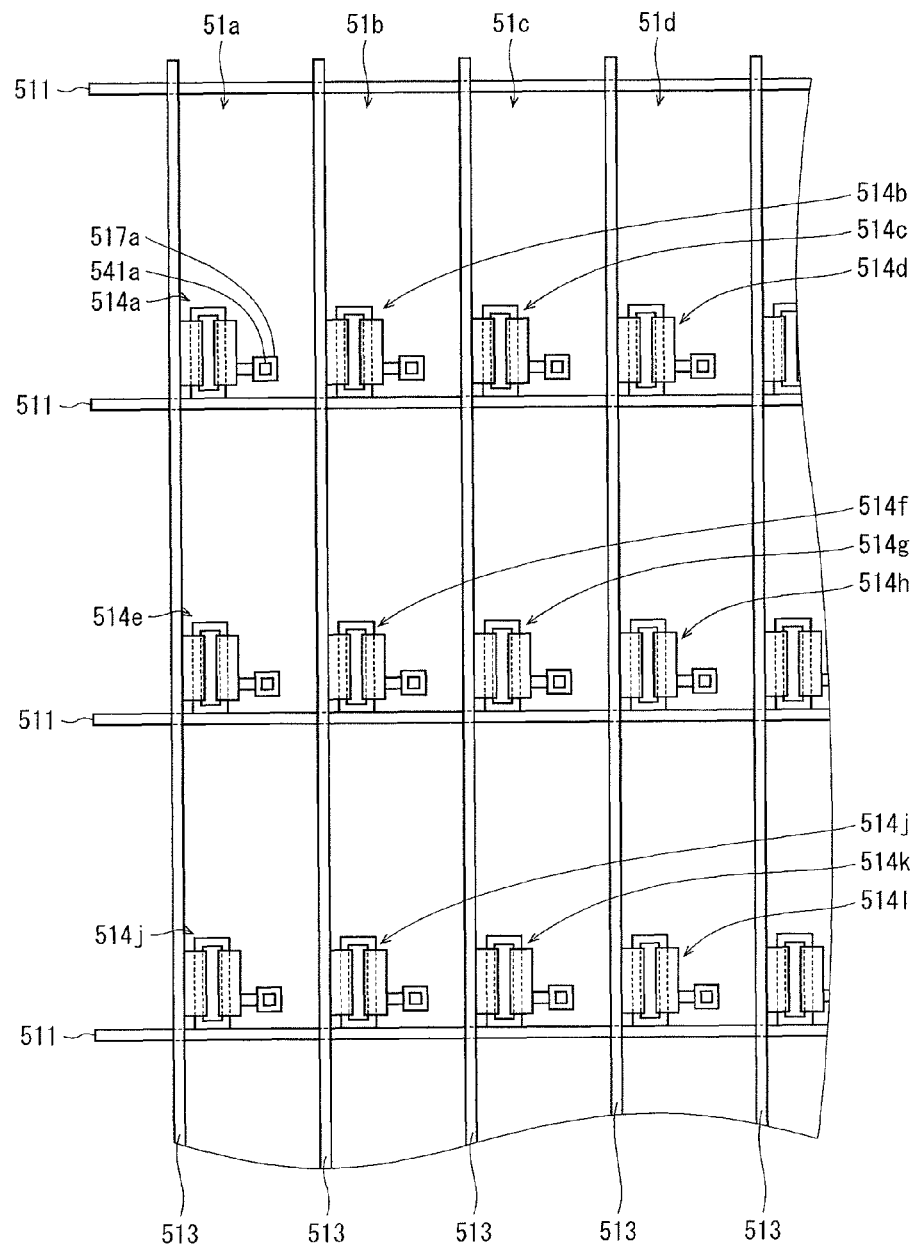
FIG. 14 is a plan view showing a layout of TFT layers.

In the above-mentioned embodiment, each of the TFT layers includes two thin-film transistor elements and one holding capacitor. The present invention, however, is not limited to this structure. For example, as shown in FIG. 14, each of the TFT layers may include one thin-film transistor element. In this example, a gate line 511 is provided for each row, and a power line 513 is provided for each column. When attention is focused on a TFT layer 51a, one driving transistor 514a is formed in one region defined in 4K2K. A source/drain electrode of the driving transistor 514a is electrically connected to an extraction electrode 517a, and the extraction electrode 517a is electrically connected to a pixel electrode via a contact portion 541a.

(3) Driving Method

In the above-mentioned embodiment, the organic EL panel is an active matrix organic EL panel including a pixel circuit for each sub-pixel. The present invention, however, is not limited to this structure. For example, the organic EL panel may be a passive matrix organic EL panel. In the passive matrix organic EL panel, a light-emitting layer is formed between a first electrode wiring layer and a second electrode wiring layer, a plurality of belt-shaped row-direction electrode wires are arranged in rows on the first electrode wiring layer, and a plurality of belt-shaped column-direction electrode wires are arranged in columns on the second electrode wiring layer. Crossing regions where the row-direction electrode wires and the column-direction electrode wires cross each other correspond to respective sub-pixels. When the present invention is applied to the passive matrix organic EL panel having the above-mentioned structure, the first electrode wiring layer is to be formed in accordance with 4K2K, and the second electrode wiring layer is to be formed in accordance with Full HD.

(4) Number of Joined Sub-pixels

In the above-mentioned embodiment, four sub-pixels in a standard having a high resolution are used as one sub-pixel in a standard having a low resolution. The present invention, however, is not limited to this structure. Use of an integer (equal to or greater than two) number of sub-pixels as one sub-pixel can produce an effect of increasing a possibility that the display defect falls within the allowable range.

(5) Layout of Joined Sub-pixels

In the above-mentioned embodiment, as four sub-pixels to be joined, two sub-pixels adjacent to each other in the row direction and other two sub-pixels adjacent to the respective two sub-pixels in the column direction are selected. The present invention, however, is not limited to this structure. For example, four contiguous sub-pixels arranged in the row direction or four contiguous sub-pixels arranged in the column direction may be selected. As in the case of (d) of FIG. 8, for example, two nearest neighboring sub-pixels emitting light of the same color and being arranged in the row direction, and other two sub-pixels adjacent to the respective two nearest neighboring sub-pixels in the column direction may be selected. In this case, since sub-pixels emitting light of respective three colors are arranged in the row direction, between the two nearest neighboring sub-pixels emitting light of the same color and being arranged in the row direction thus selected, there are two sub-pixels emitting light of different colors from the nearest neighboring sub-pixels. As in this case, sub-pixels to be joined may be arranged separately with one or more sub-pixels emitting light of different colors therebetween.

(6) Resolution

In the above-mentioned embodiment, 4K2K is taken as an example of the standard having a high resolution, and Full HD is taken as an example of the standard having a low resolution. The present invention, however, is not limited to this structure. Various standards have been proposed for applications, such as a digital television, a personal computer monitor, a portable terminal including a mobile phone and a portable music player. The present invention is applicable to various standards as described above.

(7) Shape of Partition Wall

In the above-mentioned embodiment, apertures of the partition wall are provided for respective sub-pixels. The present invention, however, is not limited to this structure. Each of the apertures may be provided to be shared by a plurality of sub-pixels. For example, each of the apertures may be provided to be shared by sub-pixels arranged in a corresponding one of the columns, as in a so-called line bank.

(8) Method for Extracting Light

In the above-mentioned embodiment, the organic EL panel is a top emission type organic EL panel using a light reflective material for the pixel electrodes and using a light-transmissive material for the common electrode. The present invention, however, is not limited to this structure. The present invention is also applicable to a bottom emission type organic EL panel.

(9) Product Form

Figure 15:
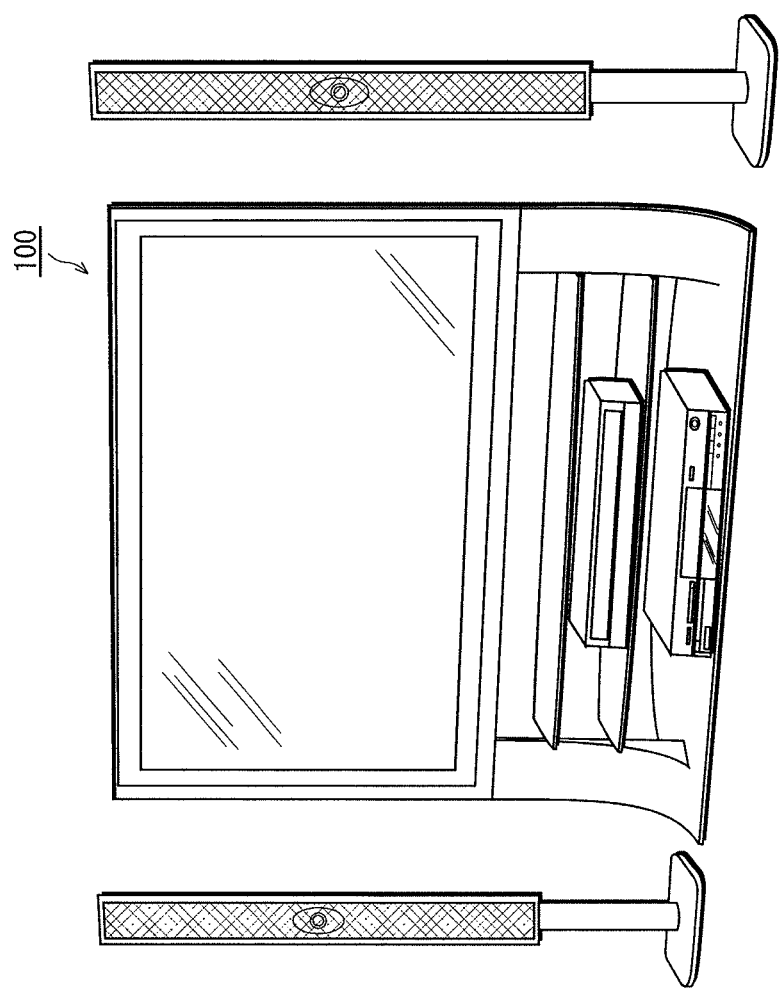
FIG. 15 shows an appearance of an example of a display device.

The organic EL panel described in the above-mentioned embodiment may directly be distributed to a sales route, or may be distributed after being incorporated into a display device such as a digital television (see FIG. 15).

(10) Defect Inspection

In the above-mentioned embodiment, inspection is conducted three times. The present invention, however, is not limited to this structure. For example, the inspection may be conducted only once or twice.

INDUSTRIAL APPLICABILITY

The present invention is applicable, for example, to a display device such as a digital television.

REFERENCE SIGNS LIST 11 substrate
12a -12l TFT layer
13 interlayer insulation film
14a-14d pixel electrode
15 partition wall
15a-15d aperture
16a-16d light-emitting layer
17 common electrode 18 sealing layer
19 black matrix
20a, 20b color filter
21 substrate
22 insulating material
51a -51d TFT layer
100 organic EL panel
121 gate line
122 data line
123 power line
124 switching transistor
125 driving transistor
126 holding capacitor
127 extraction electrode
141a-141l contact portion
511 gate line
513 power line
514a-514l driving transistor
517a extraction electrode
541a contact portion

The invention claimed is:

1. An active matrix display panel having a plurality of pixels arranged in a matrix of rows and columns, wherein
   each of the pixels is composed of a plurality of first sub-pixels emitting light of different colors,
   each of the first sub-pixels is composed of a plurality of second sub-pixels emitting light of the same color,
   each of the second sub-pixels includes:
      a first electrode;
      a second electrode above the first electrode;
      a light-emitting layer between the first electrode and the second electrode; and
      a pixel circuit configured to feed power to the first electrode, and
   the pixel circuit includes a gate line and a data line.

2. The active matrix display panel of claim 1, wherein
   the first electrode is a pixel electrode provided individually for each of the second sub-pixels, and
   the second electrode is a part, above the pixel electrode, of a common electrode provided to extend across the plurality of pixels.

3. The active matrix display panel of claim 1, wherein
   the first electrode is a part of a pixel electrode provided individually for each of the first sub-pixels, and
   the second electrode is a part, above the part of the pixel electrode, of a common electrode provided to extend across the plurality of pixels.

4. The active matrix display panel of claim 3, wherein
   at least one of the first sub-pixels includes at least one second sub-pixel having a display defect.

5. The active matrix display panel of claim 4, wherein
   the display defect is attributed to a defect of the pixel circuit,
   in each second sub-pixel not having the display defect, the pixel circuit is electrically connected to the first electrode, and
   in each second sub-pixel having the display defect, the pixel circuit is electrically disconnected from the first electrode.

6. The active matrix display panel of claim 5, wherein
   the pixel circuit includes a thin-film transistor element.

7. The active matrix display panel of claim 4, wherein
   the display defect is at least one of an unlit dot and a dark dot.

8. The active matrix display panel of claim 1, wherein
   the number of the second sub-pixels is an integer multiple of the number of the first sub-pixels.

9. The active matrix display panel of claim 1, wherein
   the plurality of second sub-pixels included in each of the first sub-pixels are arranged adjacently.

10. The active matrix display panel of claim 1, wherein
    the plurality of second sub-pixels included in each of the first sub-pixels are arranged separately with a second sub-pixel emitting light of a different color therebetween.

11. A method for manufacturing an active matrix display panel, the method comprising:
    preparing a substrate; and
    forming, on the substrate, a plurality of pixels arranged in a matrix of rows and columns, wherein
    the forming of the pixels includes
       forming, for each of the pixels, a plurality of first sub-pixels emitting light of different colors,
    the forming of the first sub-pixels includes
       forming, for each of the first sub-pixels, a plurality of second sub-pixels emitting light of the same color, and
    the forming of the second sub-pixels includes:
       forming a first electrode;
       forming a second electrode above the first electrode;
       forming a light-emitting layer between the first electrode and the second electrode;
       forming a pixel circuit configured to feed power to the first electrode; and
       forming a gate line and a data line for the pixel circuit.

12. A method for manufacturing an active matrix display panel, the method comprising:
    preparing a substrate; and
    forming, on the substrate, a plurality of pixels arranged in a matrix of rows and columns, wherein
    the preparing of the substrate includes:
       forming a thin-film transistor array substrate including pixel circuits arranged in a matrix of rows and columns, each of the pixel circuits including a thin-film transistor element, a gate line, and a data line; and
       after forming the thin-film transistor array substrate, inspecting the thin-film transistor array substrate for any display defect, and
    the forming of the pixels includes:
       when the display defect found in the inspecting of the thin-film transistor array substrate is not within an allowable range, forming pixel electrodes such that one pixel electrode is allocated to each group of pixel circuits, the number of the pixel circuits included in each group being an integer equal to or greater than two;
       forming light-emitting layers on the respective pixel electrodes; and
       forming, on the light-emitting layers, a common electrode to extend across the plurality of pixels.

13. The method for manufacturing the active matrix display panel of Claim 12, wherein
    in the forming of the pixel electrodes, an area of each of the pixel electrodes is an integer multiple of an area of each of the pixel circuits, the integer being equal to or greater than two.

14. The method for manufacturing the active matrix display panel of claim 12, wherein
    the preparing of the substrate further includes
       after forming the thin-film transistor array substrate and before inspecting the thin-film transistor array substrate, forming an insulation film on the thin-film transistor array substrate, the insulation film having contact holes.

15. A method for manufacturing an active matrix display panel, the method comprising:
preparing a substrate; and
forming, on the substrate, a plurality of pixels arranged in a matrix of rows and columns, wherein
the preparing of the substrate includes:
   forming a thin-film transistor array substrate including pixel circuits arranged in a matrix of rows and columns, each of the pixel circuits including a thin-film transistor element, a gate line, and a data line; and
   forming an insulation film on the thin-film transistor array substrate, the insulation film having contact holes,
the forming of the pixels includes:
   forming, on the insulation film, pixel electrodes such that one pixel electrode is allocated to each of the pixel circuits;
   inspecting the pixel electrodes for any defect;
   forming, on the insulation film, a partition wall having apertures;
   forming light-emitting layers on one or more pixel electrodes in the respective apertures; and
   forming, on the light-emitting layers, a common electrode to extend across the plurality of pixels, and
in the forming of the partition wall, when the display defect found in the inspecting of the pixel electrodes is not within an allowable range, forming the apertures such that one aperture is allocated to each group of pixel electrodes, the number of the pixel electrodes included in each group being an integer equal to or greater than two.

16. The method for manufacturing the active matrix display panel of claim 15, wherein
in forming of the partition wall, an area of each of the apertures is an integer multiple of an area of each of the pixel electrodes, the integer being equal to or greater than two.

17. A method for manufacturing an active matrix display panel, the method comprising:
preparing a substrate; and
forming, on the substrate, a plurality of pixels arranged in a matrix of rows and columns, wherein
the preparing of the substrate includes:
   forming a thin-film transistor array substrate including pixel circuits arranged in a matrix of rows and columns, each of the pixel circuits including a thin-film transistor element, a gate line, and a data line; and
   forming an insulation film on the thin-film transistor array substrate, the insulation film having contact holes,
the forming of the pixels includes:
   forming, on the insulation film, pixel electrodes such that one pixel electrode is allocated to each of the pixel circuits;
   forming, on the insulation film, a partition wall having apertures provided for the respective pixel electrodes;
   inspecting the pixel electrodes or the partition wall for any defect;
   forming light-emitting layers on the respective pixel electrodes in the apertures; and
   forming, on the light-emitting layers, a common electrode to extend across the plurality of pixels, and
in forming of the light-emitting layers, when the defect found in the inspecting of the pixel electrodes or the partition wall is not within an allowable range, light-emitting layers emitting light of the same color are formed in apertures in the same unit, and light-emitting layers emitting light of different colors are formed in apertures in different units, each unit being composed of a plurality of adjacent apertures.

* * * * *